United States Patent
Yersin et al.

(10) Patent No.: US 9,252,372 B2
(45) Date of Patent: Feb. 2, 2016

(54) COMPLEXES FOR USE IN OPTOELECTRONIC COMPONENTS

(75) Inventors: Hartmut Yersin, Sinzing (DE); Uwe Monkowius, Linz (AT)

(73) Assignee: Merck Patent GmbH (DE)

(*) Notice: Subject to any disclaimer, the term of this patent is extended or adjusted under 35 U.S.C. 154(b) by 655 days.

(21) Appl. No.: 13/001,703

(22) PCT Filed: Jun. 23, 2009

(86) PCT No.: PCT/EP2009/004498
§ 371 (c)(1),
(2), (4) Date: Dec. 28, 2010

(87) PCT Pub. No.: WO2010/006681
PCT Pub. Date: Jan. 21, 2010

(65) Prior Publication Data
US 2011/0108769 A1    May 12, 2011

(30) Foreign Application Priority Data

Jul. 17, 2008 (DE) .................. 10 2008 033 563

(51) Int. Cl.
*H01L 51/54* (2006.01)
*C09K 11/06* (2006.01)
(Continued)

(52) U.S. Cl.
CPC .............. *H01L 51/009* (2013.01); *C09K 11/06* (2013.01); *H01L 51/5012* (2013.01); *H01L 51/5016* (2013.01); *H05B 33/14* (2013.01); *C09K 2211/185* (2013.01); *H01L 51/0072* (2013.01); *H01L 51/0084* (2013.01);
(Continued)

(58) Field of Classification Search
CPC .............. H01L 51/009; H01L 51/0084; H01L 51/0087; H01L 51/0091; H01L 51/50; H01L 51/5012; H01L 51/5016; C09K 11/06; C09K 2211/185; H05B 33/14; Y02E 10/549
See application file for complete search history.

(56) References Cited

U.S. PATENT DOCUMENTS 7,767,777 B2    8/2010   Buesing et al.
2004/0197600 A1*  10/2004  Thompson et al. ........... 428/690
(Continued)

FOREIGN PATENT DOCUMENTS

CN       1973386 A      5/2007
DE    102006017485 A1   10/2007
(Continued)

OTHER PUBLICATIONS

Striplin, et al., "Excited States of Homo- and Heteronuclear-Bridged Bimetallic Complexes of Rhodium(I), Iridium(I), Platinum(I), and Gold(I). Triplet Manifold Splittings, state Assignments, and Symmetry Correlations," *J. Phys. Chem.*, vol. 99, pp. 7977-7984 (1995).
(Continued)

*Primary Examiner* — Michael H Wilson
(74) *Attorney, Agent, or Firm* — Drinker Biddle & Reath LLP

(57) ABSTRACT

The invention relates to the use of a multinuclear metal or transition metal complex in an organic electronic device, said complex having a small $\Delta E$ spacing, particularly between 50 $cm^{-1}$ and 2000 $cm^{-1}$, between the lowest triplet state and the singlet state that is higher and is achieved by thermal backfilling from the triplet. The invention further relates to the use of the strong absorptions of such multinuclear metal complexes, particularly in OSCs.

12 Claims, 1 Drawing Sheet

(51) Int. Cl.
  *H01L 51/00* (2006.01)
  *H01L 51/50* (2006.01)
  *H05B 33/14* (2006.01)
(52) U.S. Cl.
  CPC ........ *H01L 51/0087* (2013.01); *H01L 51/0091* (2013.01); *Y02E 10/549* (2013.01)

(56) References Cited

U.S. PATENT DOCUMENTS

| | | | |
|---|---|---|---|
| 2005/0079384 | A1 | 4/2005 | Tsuboyama et al. |
| 2005/0211974 | A1* | 9/2005 | Thompson et al. ............. 257/40 |
| 2006/0058494 | A1 | 3/2006 | Busing et al. |
| 2006/0078757 | A1 | 4/2006 | Boerner |
| 2006/0258043 | A1* | 11/2006 | Bold et al. ...................... 438/99 |
| 2006/0279204 | A1 | 12/2006 | Forrest et al. |
| 2007/0111025 | A1 | 5/2007 | Lennartz et al. |
| 2009/0054657 | A1 | 2/2009 | Molt et al. |
| 2009/0096367 | A1 | 4/2009 | Fuchs et al. |
| 2009/0206735 | A1 | 8/2009 | Yersin et al. |
| 2011/0108769 | A1 | 5/2011 | Yersin et al. |
| 2011/0144366 | A1 | 6/2011 | Stoessel et al. |
| 2013/0020560 | A1 | 1/2013 | Yersin et al. |

FOREIGN PATENT DOCUMENTS

| | | |
|---|---|---|
| DE | 102008033943 A1 | 1/2010 |
| EP | 1930392 A1 | 6/2008 |
| EP | 2175490 A2 | 4/2010 |
| EP | 2175491 A2 | 4/2010 |
| EP | 2175503 A2 | 4/2010 |
| EP | 2175505 A2 | 4/2010 |
| EP | 2297276 B1 | 6/2013 |
| JP | 2004/241374 | 8/2004 |
| JP | 2006/024830 | 1/2006 |
| KR | 20050109618 A | 11/2005 |
| WO | WO 02/15645 A1 | 2/2002 |
| WO | WO-2004/037887 A2 | 5/2004 |
| WO | WO-2005/056712 A1 | 6/2005 |
| WO | WO-2005/118606 A1 | 12/2005 |
| WO | WO-2007/031185 A1 | 3/2007 |
| WO | WO-2007/046201 A1 | 4/2007 |
| WO | WO-2007/095118 A2 | 8/2007 |
| WO | WO-2007/115970 A1 | 10/2007 |
| WO | WO-2007/115981 A1 | 10/2007 |
| WO | WO-2007/118671 A1 | 10/2007 |
| WO | WO-2010/006666 A1 | 1/2010 |

OTHER PUBLICATIONS

Xia, et al., "Metal-Metal Interactions in Dinuclear $d^8$ Metal Cyanide Complexes Supported by Phosphine Ligands. Spectroscopic Properties and ab Initio Calculations of $[M_2(\mu\text{-diphosphine})_2(CN)_4]$ and trans-$[M(\text{phosphine})_2(CN)_2]$ (M-Pt, Ni)," *Inor. Chem.*, vol. 41, pp. 3866-3875 (2002).

Pan, et al., "Spectroscopic Properties of Mono and Binuclear Platinum(II) Alkynyl Complexes with Phosphine Ligands: A Theoretical Study," *Inorganica Chimica Acta*, vol. 359, pp. 3306-3314 (2006).

Petz, et al., "Reaction of the Carbodiphosphorane $Ph_3P=C=PPh_3$ with Platinum(II) and -(O) Compounds: Platinum Induced Activation of C—H Bonds," *Organometallics*, vol. 24, pp. 5038-5043 (2005).

Kenney, et al., "The Nature of the Low-Lying Excited States of Bridged Rhodium(I) and Iridium(I) Binuclear Complexes," *Organometallics*, vol. 5, pp. 230-234 (1986).

Kenney, et al., "Electronic States of Rhodium(I) Binuclear A-Frame Complexes," *Inorg. Chem.*, vol. 25, pp. 1506-1508 (1986).

Harvey, "Luminescence Properties of Organometallics/Coordination Oligomers and Polymers Containing Diphosphine and Diisocyanide Assembling Ligands: Comparison Between Mononuclear Model Complexes and Polymers," *Macromol. Symp.*, vol. 209, pp. 81-95 (2004).

Miskowski, et al., "Spectroscopy and Photophysics of $Rh_2(\text{dimen})4^{2+}$ (dimen=1,8-diisocyanomenthane). Exceptional Metal-Metal Bond Shortening in the Lowest Electronic Excited States," *Inorg. Chem.*, vol. 33, pp. 2799-2807 (1994).

Stace, et al., "Rhodium Dimers with 2,2-dimethyl-1,3-Diisocyano and Bis(Diphenylphosphino)Methane Bridging Ligands," *Inor. Chem.*, vol. 45, pp. 9123-9131 (2006).

Abedin-Siddique, Z., et al., "Intense Fluorescence of Metal-to-Ligand Charge Transfer in $[Pt(0)(\text{binap})_2]$ [binap = 2,2'-Bis(diphenylphosphino)-1,1'-binaphthyl]", Inorganic Chemistry, vol. 43, (2004) pp. 663-673.

Blasse, G., et al., "On The Luminescence of Bis(Triphenylphosphine) Phenanthroline Copper(I)", Chemical Physics Letters, vol. 70, No. 1, (1980), pp. 1-3.

Fang, C., et al., "Iridium(I) Pyridyl Azolate Complexes with Saturated Red Metal-to-Ligand Charge Transfer Phosphorescence; Fundamental and Potential Applications in Organic Light-Emitting Diodes", Chemistry European Journal, vol. 13, (2007), pp. 2686-2694.

Inga, M., et al., "The Nature of the Low-Lying Excited States of Bridged Rhodium(I) and Iridium(I) Binuclear Complexes", Organometallics, vol. 5, (1985), pp. 230-234.

Inorganic Chemistry, vol. 25, No. 9, (1986), pp. 1506-1508.

Kirchhoff, J., et al., "Temperature Dependence of Luminescence from $Cu(NN)_2$ + Systems in Fluid Solution. Evidence for the Participation of Two Excited States", Inorg. Chem., vol. 22, (1983), pp. 2380-2384.

Miskowski, V., et al., "Flash Kinetic Spectroscopic Studies of Dinuclear Rhodium (I) Complexes", J. Am. Chem. Soc., vol. 100, No. 2, (1978), pp. 485-488.

Niskikawa, Y., et al., "Delayed Fluorometric Analysis of Chlorophyll C and Pheophytin C", The Japan Society for Analytical Chemistry, vol. 32, (1983), pp. E115-E122.

Office Action from corresponding Chinese Application No. 200980125116.5 dated Jan. 30, 2013.

Takahashi, A., et al., "Development of Highly Efficient Thermally Activated Delayed Fluorescent Porphyrins and its Application to the Polmer OLED5", OSA/FIO, (2005), pp. 1.

Tsuboyama, A., et al., "Photophysical Properties of Highly Luminescent Copper(I) Halide Complexes Chelated with 1,2-Bis(diphenylphosphino) benzene", Inorganic Chemistry, vol. 46, (2007), pp. 1992-2001.

Valeur, B., et al., "Molecular Fluorescence—Principles and Applications", Wiley-VCH, (2001).

Zhang, Q., et al., "Triplet Exciton Confinement in Green Organic Light-Emitting Diodes Containing Luminescent Charge-Transfer Cu(I) Complexes", Advanced Functional Materials, vol. 22, (2012), pp. 2327-2336.

Baldo, M., et al., "Highly efficient phosphorescent emission from organic electroluminescent devices", Nature, vol. 395, (1998), pp. 151-154.

Baldo, M., et al., "Very high-efficiency green organic light-emitting devices based on electrophosphorescence", Applied Physics Letters, vol. 75, No. 1, (1999), pp. 4-6.

Erk, P., et al., "11.2: Efficient Deep Blue Triplet Emitters for OLEDs", vol. 11.2, (2006).

Haneder, S., et al., "Controlling the Radiative Rate of Deep-Blue Electrophosphorescent Organometallic Complexes by Singlet-Triplet Gap Engineering", Advanced Materials, vol. 20, (2008), pp. 3325-3330.

Köhler, A., et al., "Triplet states in organic semiconductors", Materials Science and Engineering, vol. 66, (2009), pp. 71-109.

Ma, Y., et al., "High Luminescence Gold(I) and Copper(I) Complexes with a Triplet Excited State for Use in Light-Emitting Diodes", Advanced Materials, vol. 11, No. 10, (1999), pp. 852-857.

Nozaki, K., et al., "Theoretical Studies on Photophysical Properties and Mechanism of Phosphorescence in [fac-Ir(2-phenylpyridine)$_3$]", Journal of Chinese Chemical Society, vol. 53, (2006), pp. 101-112.

Sajoto, T., et al., "Blue and Near-UV Phosphorescence from Iridium Complexes with Cyclometalated Pyrazoyl or N-Heterocyclic Carbene Ligands", Inorganic Chemistry, vol. 44, No. 22, (2005), pp. 7992-8003.

Schildknecht, C., et al., "Novel deep-blue emitting phosphorescent emitter", Proc. of SPIE. vol. 5937, pp. 59370E, 2005.

(56) References Cited

OTHER PUBLICATIONS

Yersin, H., et al., "Low-Lying Electronic States and Photophysical Properties of Organometallic Pd(II) and Pt(II) Compounds. Modern Research Trends Presented in Detailed Case Studies", Topics in Current Chemistry, vol. 214, (2001), pp. 81-186.

English Translation of the Taiwanese Office Action regarding Application No. 098123748 dated Aug. 18, 2014.

* cited by examiner

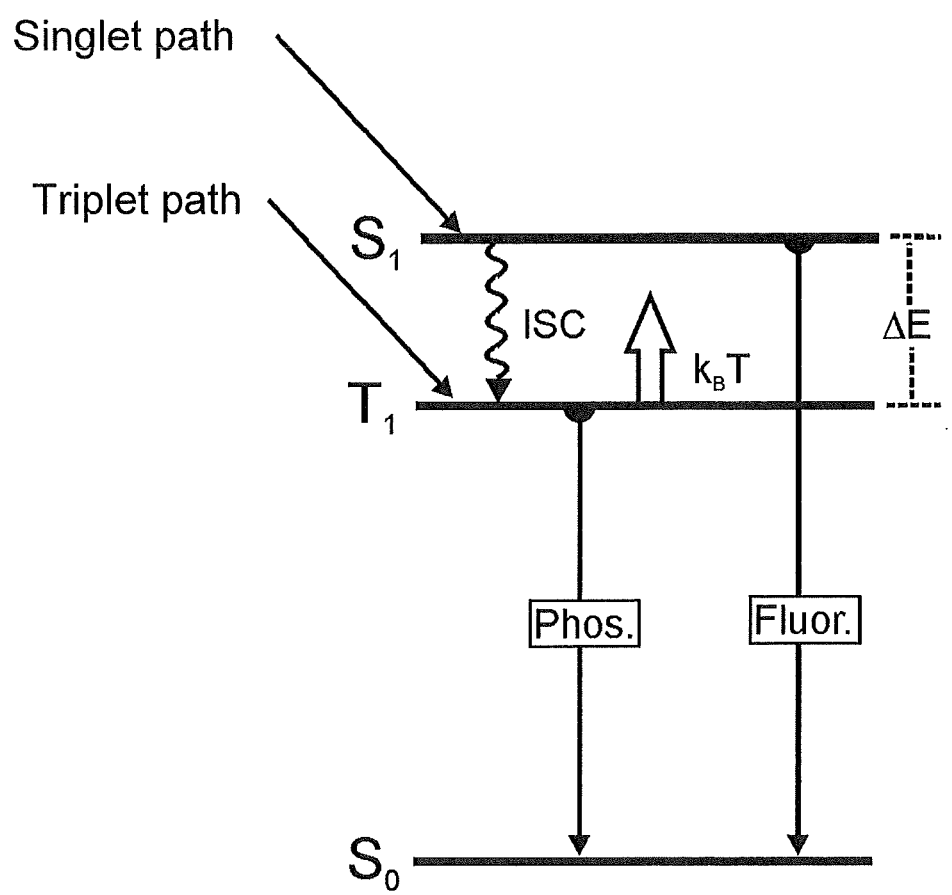

COMPLEXES FOR USE IN OPTOELECTRONIC COMPONENTS

RELATED APPLICATIONS

This application is a national stage application (under 35 U.S.C. §371) of PCT/EP2009/004498, filed Jun. 23, 2009, which claims benefit of German Application No. 10 2008 033 563.0, filed Jul. 17, 2008.

The invention relates to bi- and polynuclear metal complexes which are characterised in that they have small singlet-triplet energy separations and exhibit the so-called triplet harvesting effect. The invention furthermore relates to the use of these complexes in opto-electronic components.

Introduction

Electroluminescent compounds are the core of organic light-emitting diodes (OLEDs). These compounds are generally applied by vacuum sublimation or by wet-chemical methods. In wet-chemical methods, the compounds are generally embedded in or chemically bonded to polymeric materials, which are generally of such a nature that suitable charge carriers (electrons or holes) can be generated and transported in them, with the proviso that excitons, which transfer their excess energy to the respective electroluminescent compound, are formed when oppositely charged charge carriers collide. This electroluminescent compound can then be converted into a particular electronic excited state, which is then converted by light emission into the associated ground state as completely as possible and with substantial avoidance of non-radiative deactivation processes.

A suitable electronic excited state which can also be formed by energy transfer from a suitable precursor exciton is, apart from a few exceptions, either a singlet state or a triplet state. Since, owing to the spin statistics, the two states are generally occupied in the ratio 1:3, only a maximum of 25% of the excitons generated on emission from the singlet state, which is known as fluorescence, result in emission again. By contrast, all excitons in the case of triplet emission, which is known as phosphorescence, can be utilised, converted and emitted as light (triplet harvesting), meaning that the internal quantum yield can achieve a value of 100% in this case if the singlet state, which is excited at the same time and is energetically above the triplet state, relaxes completely into the triplet state (intersystem crossing) and non-radiative competing processes remain unimportant. Thus, triplet emitters are generally more efficient electroluminophores and are more suitable for providing a high light yield in an organic light-emitting diode.

However, the phosphorescent triplet emitters known to date in OLEDs have the disadvantage that the emission lifetime, which is in the region of microseconds, is relatively long. This gives rise to disadvantages, namely that the majority of or all emitter molecules exhibit saturation effects with increasing current densities due to the occupation. Consequently, further charge-carrier currents can no longer result in occupation of the excited and emitting states. Only undesired ohmic losses then result. As a consequence, a significant drop in efficiency of the OLED device (so-called "roll-off" behaviour) arises with increasing current density. In a similarly unfavourable manner, the effects of triplet-triplet annihilation and self-quenching arise (see in this respect ref. [1]). A significant reduction in the emission lifetime of the emitter molecules could greatly weaken these processes of efficiency reduction.

Surprisingly, it is possible to utilise an effect which results in a drastic shortening of the emission lifetime, but where the high efficiency facilitated by triplet harvesting can nevertheless be fully achieved. This is the "singlet harvesting" process, which is proposed here for the first time. This is explained in FIG. 1. The $T_1$ state is occupied by the already known effects of triplet harvesting [2], and the usual $T_1 \rightarrow S_0$ phosphorescence results, but with the unfavourably long emission lifetime. Interestingly, the complex compounds proposed for use in accordance with the invention have a very small energetic separation $\Delta E$ between the singlet $S_1$ and the triplet $T_1$. In this case, very efficient thermal re-occupation from the initially very efficiently occupied $T_1$ state into the $S_1$ state can occur at room temperature. This process is controlled by the Boltzmann distribution in accordance with equation (1). The intensity ratio is then given by $$\mathrm{Int}(S_1 \rightarrow S_0)/\mathrm{Int}(T_1 \rightarrow S_0) = k(S_1)/k(T_1)\exp(-\Delta E/k_B T) \quad (1)$$

$k_B$ here represents the Boltzmann constant and T represents the absolute temperature. $k(S_1)/k(T_1)$ is the rate ratio of the transfer process from the singlet $S_1$ relative to that from the triplet $T_1$ into the electronic ground state $S_0$. For the complexes proposed for use in accordance with the invention, this ratio is in the order of $10^3$ or more.

The thermal re-occupation process described opens a fast emission channel from the short-lived $S_1$ state, and the overall lifetime is significantly reduced. This reduction is more pronounced, the smaller the energy difference $\Delta E$. This will be explained with reference to a numerical example. For a typical energy difference of $\Delta E = 500$ cm$^{-1}$, an intensity ratio of about 40 arises from equation (1) for room-temperature applications (T=300 K) with $k_B T=200$ cm$^{-1}$ and a rate ratio of $0.5 \times 10^3$ cm$^{-1}$. This means that, in this typical example, singlet emission is 40 times more intense than triplet emission. A singlet harvesting effect is thus present.

Interestingly, the compounds to be employed in accordance with the invention exhibit these very small energy differences $\Delta E$. As a consequence of the singlet harvesting effect, the emission lifetimes are greatly reduced, and values of about or even below 100 ns are achieved. In the above example, the lifetime achieved (assuming a singlet lifetime of 2 ns) is only about 25 ns.

The complexes according to the invention exhibit a $\Delta E$ separation of between 50 cm$^{-1}$ and 3000 cm$^{-1}$, preferably between 50 cm$^{-1}$ and 2000 cm$^{-1}$, particularly preferably between 50 cm$^{-1}$ and 1000 cm$^{-1}$, very particularly preferably between 50 cm$^{-1}$ and 500 cm$^{-1}$.

The OLED devices are produced by the processes corresponding to the prior art (cf. [1]).

Another important aim is efficient conversion of solar energy into electrical energy. Many of the associated requirements of the device structure are similar to those for the construction of an OLED. Thus, care must be taken in OLEDs that holes, coming from the anode, and electrons, coming from the cathode, recombine at the metal complexes and emit light. Conversely, it must be ensured in organic solar cells (OSCs) or organic photo-voltaics (OPVs), starting from the metal complexes excited by sunlight, that re-emission of light does not occur, but instead that holes and electrons are formed and migrate to the anode or cathode. In the process leading to the generation of the photocurrent in an organic solar cell, which is composed of a plurality of "elementary" steps, a photon of the incident light is firstly absorbed by a dye molecule in the absorption layer. The dye molecule is thus electronically excited. Since the molecule has different redox properties in the excited state (exciton) than in the ground state, electrical charge separation arises within the absorption layer or at one of the layer boundaries in the case of suitably selected HOMO and LUMO levels of the hole-conductor and electron-conductor layers relative to the HOMO/LUMO levels of the absorption layer. The resultant electrons and holes migrate through the respective electron- and hole-conduction layers in the direction of the electrodes, causing an electric voltage to arise at the electrodes. This functional principle gives rise to the requirements of the substances used in the device:

i) very high absorption of the dye over the entire visible spectral region as far as the near-IR region,
ii) relatively good hole or electron conductivities of the layers provided for this purpose,
iii) good exciton transport in the absorption layer,
iv) effective and fast exciton dissociation and removal of the charge carriers in the absorption layer or at one of the boundary layers in order to prevent hole-electron recombination.

The problems described in the prior art in the production of efficient OSCs arise essentially for the following two reasons:

i) the lack of materials having high light absorption from the visible spectral region to the near-infrared spectral region and
ii) the lack of materials having long exciton diffusion lengths, which ensure migration of the excitons out of the interior of the light-absorbing layer to, for example, the interface at which the separation of the excitons takes place.

The light absorption strength of a material at a given wavelength $\lambda$ is given by the Lambert-Beer law:

$$-\log(I/I_0)=\epsilon(\lambda)cd \qquad (2)$$

where I=intensity of the transmitted light, $I_0$=intensity of the incident light, c=concentration of the absorbing substance and d=path length of the light in the material, and $\epsilon(\lambda)$=molar decadic absorption coefficient.

Assuming that 99% of the incident light is absorbed, i.e. $I/I_0=0.01$ or $-\log(I/I_0)=2$, and neglecting reflections, and with a value of c=5 mol/l (typical solid concentrations of metal complexes which are the subject-matter of the present invention) and d=100 nm (thickness of the light-absorption layer in an OSC), the requisite molar absorption coefficients can be estimated as at least $10^4$ l mol$^{-1}$cm$^{-1}$ to $10^5$ l mol$^{-1}$cm$^{-1}$.

However, the $\epsilon(\lambda)$ values for the transition-metal complexes used to date as OSC materials are typically only $10^3$ l mol$^{-1}$cm$^{-1}$ to $10^4$ l mol$^{-1}$cm$^{-1}$ (measured at the maximum of the absorption band in the visible region).

OSC and OPV devices are produced by the processes corresponding to the prior art (cf. [3]).

DESCRIPTION OF THE INVENTION

Accordingly, the present invention had the object of providing substances, in particular emitter substances for OLEDs or absorption dyes for OSCs, with which the disadvantages of the prior art can be overcome or with which, in particular, OLEDs having emitters with a short emission lifetime and OSCs having high absorption can be produced.

This object is achieved by the provision of an organic electronic device comprising a mono- or polynuclear metal complex, in particular a transition-metal complex, which has a small $\Delta E$ separation between the lowest triplet state and the higher singlet state which is occupied by thermal reoccupation from the triplet. A small $\Delta E$ separation here means a separation of between 50 cm$^{-1}$ and 3000 cm$^{-1}$, preferably between 50 cm$^{-1}$ and 2000 cm$^{-1}$, particularly preferably between 50 cm$^{-1}$ and 1000 cm$^{-1}$, in particular between 50 cm$^{-1}$ and 500 cm$^{-1}$.

A BRIEF DESCRIPTION OF THE FIGURE

FIG. 1 illustrates a "singlet harvesting" process.

The present invention furthermore relates to the use of a mono- or polynuclear metal complex, in particular a transition-metal complex, which has a small $\Delta E$ separation between the lowest triplet state and the higher singlet state which is occupied by thermal reoccupation from the triplet, in an organic electronic device. A small $\Delta E$ separation here means a separation of between 50 cm$^{-1}$ and 3000 cm$^{-1}$, preferably between 50 cm$^{-1}$ and 2000 cm$^{-1}$, particularly preferably between 50 cm$^{-1}$ and 1000 cm$^{-1}$, in particular between 50 cm$^{-1}$ and 500 cm$^{-1}$.

For a given complex, the energy separation $\Delta E$ can be determined simply using equation (1) indicated above. A rearrangement gives the following:

$$\ln\{\mathrm{Int}(S_1\rightarrow S_0)/\mathrm{Int}(T_1\rightarrow S_0)\}=\ln\{k(S_1)/k(T_1)\}-(\Delta E/k_B)(1/T) \qquad (1a)$$

Any commercially available spectrophotometer can be used for the measurement. A graphic plot of the (logarithm of the) intensity ratios measured at various temperatures ln {Int $(S_1\rightarrow S_0)$/Int$(T_1\rightarrow S_0)$} against the reciprocal of the absolute temperature T generally gives a straight line. The measurement is carried out in a temperature range from room temperature to −78° C., where the temperature is set by means of a cryostat. The intensities are determined from the (corrected) spectra, where Int$(S_1\rightarrow S_0)$ and Int$(T_1\rightarrow S_0)$ respectively represent the integrated fluorescence and phosphorescence band intensities, which can be determined by means of the software belonging to the spec-trophotometer. They can easily be identified since the triplet band is at lower energies than the singlet band and increases in intensity with reducing temperature. The measurements are carried out in oxygen-free dilute solutions (about 10$^{-5}$ mol l$^{-1}$) or on thin films (about 50 nm thick) of the corresponding molecule. If the sample used is a solution, it is advisable to use a solvent or solvent mixture which forms glasses at low temperatures, such as, for example, 2-methyl-THF, THF or aliphatic hydrocarbons. If the sample used is a film, the use of a matrix having a significantly greater triplet energy, for example PMMA, is suitable. This film can be applied from solution. The slope of the straight line is $-\Delta E/k_B$. With $k_B=1.380\ 10^{-23}$ JK$^{-1}$=0.695 cm$^{-1}$ K$^{-1}$, the energy separation can be determined directly.

The organic electronic device here is preferably selected from the group consisting of organic electroluminescent devices, organic light-emitting diodes (OLEDs), light-emitting electrochemical cells (LEECs), OLED sensors, in particular gas and vapour sensors which are not hermetically screened from the outside, organic solar cells (OSCs), organic photo-voltaics (OPVs), organic field-effect transistors or organic lasers.

The compounds to be employed in accordance with the invention are mononuclear or polynuclear metal complexes. Preference is given to the use of polynuclear complexes. The polynuclear (preferably dinuclear or, for example, trinuclear) metal complexes have an M-M or M-M' or M-M-M or M-M'-M" interaction (M, M', M" are metal ion centres). This results in electronic states having the desired properties described above, i.e. these complexes have a small energy difference $\Delta E$ and consequently facilitate singlet harvesting and exhibit strong absorptions. Interestingly, electronic interactions between the metals additionally give rise to relatively high HOMOs (highest occupied molecular orbitals [1]) and relatively low LUMOs (lowest unoccupied molecular orbitals [1]). This has particular advantages for exciton formation directly on the emitter in the OLED application [2] and has favourable properties as absorber in OSCs.

Dinuclear and Polynuclear Transition-Metal Complexes

Many dinuclear and polynuclear transition-metal complexes meet the requirements of this invention owing to the small metal(M)-metal(M) separations and the significant M-M interactions. These interactions give rise to electronic states which can result in intense photoemissions and short emission lifetimes in accordance with the singlet harvesting effect and high emission quantum yields. In addition, compounds of this type generally have high absorption coefficients.

Particularly suitable for such complexes are metals having a $d^8$ electron configuration [Rh(I), Ir(I), Pd(II), Pt(II) and Au(III)] and a $d^{10}$ electron configuration [Au(I)]. $d^8$ metal centres favour a square-planar coordination, while Au(I) atoms mostly have linear coordination. In the $d^8$ systems, the bonds arise from overlap of an occupied d orbital of the first transition metal with an occupied d orbital of the second transition metal and equally by overlap of the unoccupied p orbitals along the M-M bond axis. Metal-metal bonds of this type in polynuclear transition-metal complexes are usually stabilised or only made possible at all by particular ligand systems. In dinuclear complexes, use is essentially made of bidentate ligand systems which have a short bridge function. In contrast to the conventional emitter complexes used to date, it is not necessary here for the ligands to have low-lying electronic states. In many cases—in particular for the generation of blue emission—it may even be advantageous for the electron states of the ligands to be very high and thus not to interact with the lower-lying states arising from the metal-metal interactions. The bridging ligands may be either neutral or singly or doubly negatively charged.

A. Ligands L1-L9

Ligand L in this connection is intended to be taken to mean ligands which do not have a bridging action and therefore do not have a direct influence on dimerisation. Although they are not structure-forming, they may have a major influence on the M-M separations by increasing or reducing the electron densities on the metals. The ligands are important for saturation of the coordination sphere of the metal or for charge compensation or for both. These ligands L may therefore be neutral or anionic. Furthermore, the ligands L may be monodentate or bidentate. The ligands L are denoted by L1, L2, L3, L4, L5, L6, L7, L8 and L9 below. These ligands L do not have to, and in the case of the generation of blue emission must not—like the polydentate, bridging ligands—have low-lying electronic states.

Suitable neutral, monodentate ligands L are selected from carbon monoxide, nitrogen monoxide, nitriles (RCN), isonitriles (RNC), such as, for example, tert-butyl isonitrile, cyclohexyl isonitrile, adamantyl isonitrile, phenyl isonitrile, mesityl isonitrile, 2,6-dimethylphenyl isonitrile, 2,6-di-isopropylphenyl isonitrile, 2,6-di-tert-butylphenyl isonitrile, ethers (ROR'), such as, for example, dimethyl ether, diethyl ether, sulfides (RSR'), selenides (RSeR'), amines (NR$_3$), such as, for example, trimethylamine, triethylamine, morpholine, imines (RN=CR'), phosphines, such as, for example, trifluorophosphine, trimethylphosphine, tricyclohexylphosphine, tri-tert-butylphosphine, triphenylphosphine, tris(pentafluorophenyl)phosphine, phosphites, such as, for example, trimethyl phosphite, triethyl phosphite, arsines, such as, for example, trifluoroarsine, trimethylarsine, tricyclohexylarsine, tri-tert-butylarsine, triphenylarsinine, tris(pentafluorophenyl)arsine, stibines, such as, for example, trifluorostibine, trimethyl-stibine, tricyclohexylstibine, tri-tert-butylstibine, triphenylstibine, tris(penta-fluorophenyl)stibine, and nitrogen-containing heterocycles, such as, for example, pyridine, pyridazine, pyrazine, pyrimidine, triazine. R and R' here may each, independently of one another, be hydrogen or halogen or substituents which are bonded via oxygen (—OR"), nitrogen (—NR"$_2$) or silicon (—SiR"$_3$), where R" is identical to R, and alkyl, aryl, heteroaryl and alkenyl groups or substituted alkyl, aryl, heteroaryl and alkenyl groups having substituents, such as halogens, lower alkyl groups and further generally known donor and acceptor groups. The groups R, R' and R" may also result in fused ring systems.

Suitable monoanionic, monodentate ligands L are selected from hydride, deuteride, the halides F, Cl, Br and I, azide, alkylacetylides, such as, for example, methyl-C≡C$^-$, tert-butyl-C≡C$^-$, aryl- or heteroarylacetylides, such as, for example, phenyl-C≡C$^-$, alkyl, such as, for example, methyl, ethyl, n-propyl, i-propyl, n-butyl, s-butyl, t-butyl, aryl, such as, for example, phenyl, naphthyl, heteroaryl, such as, for example, pyridyl, hydroxide, cyanide, cyanate, isocyanate, thiocyanate, isothiocyanate, aliphatic or aromatic alcoholates, such as, for example, methanolate, ethanolate, propanolate, isopropanolate, tert-butylate, phenolate, aliphatic or aromatic thioalcoholates, such as, for example, methanethiolate, ethanethiolate, propanethiolate, isopropanethiolate, tert-butylthiolate, thiophenolate, amides, such as, for example, dimethylamide, diethylamide, diisopropyl-amide, morpholide, carboxylates, such as, for example, acetate, trifluoro-acetate, propionate, benzoate, anionic, nitrogen-containing heterocycles, such as, for example, pyrrolide, imidazolide, pyrazolide, aliphatic or aromatic phosphides PR$_2^-$ or aliphatic or aromatic selenides SeR$^-$. The alkyl groups in these groups are preferably $C_1$-$C_{20}$-alkyl groups, particularly preferably $C_1$-$C_{10}$-alkyl groups, very particularly preferably $C_1$-$C_4$-alkyl groups. An aryl group is also taken to mean heteroaryl groups. These groups are as defined above.

Suitable di- or trianionic ligands $L^1$ are $O^{2-}$, $S^{2-}$, nitrenes, which result in coordination in the form R—N=M, where R generally stands for a substituent, or $N^{3-}$.

Suitable neutral or mono- or dianionic bidentate ligands are selected from diamines, such as, for example, ethylenediamine, N,N,N',N'-tetramethyl-ethylenediamine, propylenediamine, N,N,N',N'-tetramethylpropylenediamine, cis- or trans-diaminocyclohexane, cis- or trans-N,N,N',N'-tetramethyldiaminocyclohexane, imines, such as, for example, 2-[1-(phenyl-imino)ethyl]pyridine, 2-[1-(2-methylphenylimino)ethyl]pyridine, 2-[1-(2,6-di-iso-propylphenylimino)ethyl]pyridine, 2-[1-(methylimino)ethyl]pyridine, 2-[1-(ethylimino)ethyl]pyridine, 2-[1-(iso-propylimino)ethyl]pyridine, 2-[1-(tert-butylimino)ethyl]pyridine, diimines, such as, for example, 1,2-bis(methyl-imino)ethane, 1,2-bis(ethylimino)ethane, 1,2-bis(iso-propylimino)ethane, 1,2-bis(tert-butylimino)ethane, 2,3-bis(methylimino)butane, 2,3-bis(ethylimino) butane, 2,3-bis(iso-propylimino)butane, 2,3-bis(tert-butylimino)-butane, 1,2-bis(phenylimino) ethane, 1,2-bis(2-methylphenylimino)ethane, 1,2-bis(2,6-di-iso-propylphenylimino)ethane, 1,2-bis(2,6-di-tert-butylphenylimino) ethane, 2,3-bis(phenylimino)butane, 2,3-bis(2-methylphenyl-imino)butane, 2,3-bis(2,6-di-iso-propylphenylimino)butane, 2,3-bis(2,6-di-tert-butylphenylimino)butane, heterocycles containing two nitrogen atoms, such as, for example, 2,2'-bipyridine, o-phenanthroline, diphosphines, such as, for example, bis(diphenylphosphino)methane, bis(diphenyl-phosphino)ethane, bis(diphenylphosphino)propane, bis(diphenylphosphino)butane, bis(dimethylphosphino)methane, bis(dimethylphosphino)ethane, bis(dimethylphosphino) propane, bis(dimethylphosphino)butane, bis(diethylphosphino)methane, bis(diethylphosphino)ethane, bis(diethylphosphino) propane, bis(diethylphosphino)butane, bis(di-tert-butylphosphino)methane, bis(di-tert-butylphosphino)ethane, bis(tert-butylphosphino)propane, bis(tert-butylphosphino)butane, 1,3-diketonates derived from 1,3-diketones, such as, for example, acetylacetone, benzoylacetone, 1,5-diphenylacetylacetone, dibenzoylmethane, bis(1,1,1-trifluoroacetyl)-methane, 3-ketonates derived from 3-ketoesters, such as, for example, ethyl acetoacetate, carboxylates derived from aminocarboxylic acids, such as, for example, pyridine-2-carboxylic acid, quinoline-2-carboxylic acid, glycine, N,N-dimethylglycine, alanine, N,N-dimethylaminoalanine, salicyliminates derived from salicylimines, such as, for example, methylsalicylimine, ethylsalicylimine, phenylsalicylimine, dialcoholates derived from dialcohols, such as, for example, ethylene glycol, 1,3-propylene glycol, and dithiolates derived from dithiols, such as, for example, 1,2-ethylene-dithiol, 1,3-propylenedithiol.

Preference is furthermore given to bidentate monoanionic ligands which, with the metal, form a cyclometallated five- or six-membered ring with at least one metal-carbon bond, in particular a cyclometallated five-membered ring. These are, in particular, ligands as are generally used in the area of phosphorescent metal complexes for organic electroluminescent devices, i.e. ligands of the type phenylpyridine, naphthylpyridine, phenylquinoline, phenylisoquinoline, etc., each of which may be substituted or unsubstituted. A multiplicity of such ligands is known to the person skilled in the art in the area of phosphorescent electroluminescent devices, and he will be able, without inventive step, to select further ligands of this type as ligand L for the bi- or polynuclear metal complexes. The combination of two groups as depicted by the following formulae is generally particularly suitable for this purpose. The ligand L can then be formed from these groups by bonding these groups to one another in each case at the position denoted by #. The position at which the groups coordinate to the metal is denoted by *.

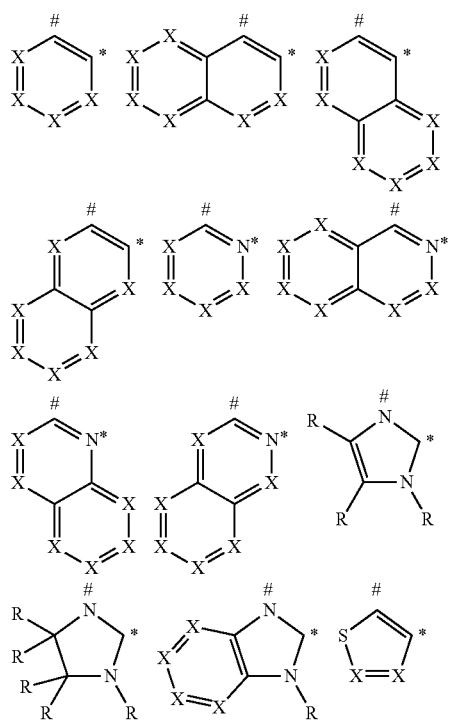

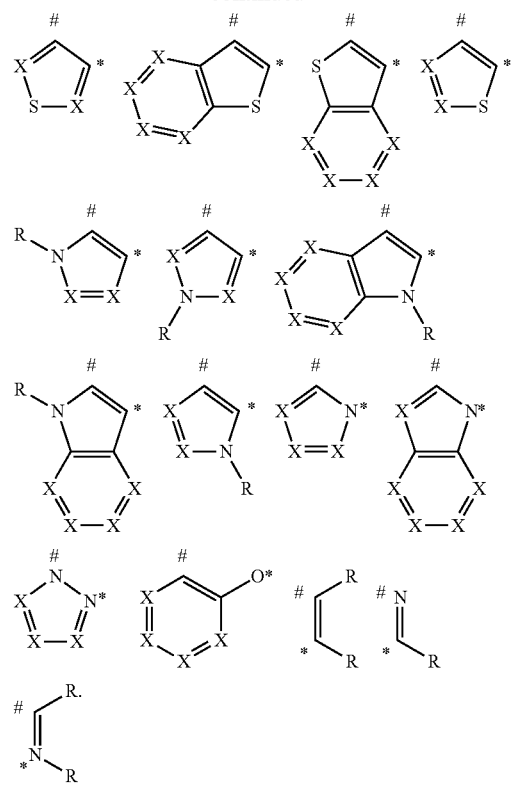

R here has the same meaning as described above, and X stands, identically or differently on each occurrence, for CR or N, with the proviso that a maximum of three symbols X in each group stand for N. Preferably a maximum of two symbols X in each group stand for N, particularly preferably a maximum of one symbol X in each group stands for N, very particularly preferably all symbols X stand for CR.

B. Dinuclear Metal Complexes

B.1 Bridging Ligands

The bridging ligands are denoted by D∩D below, where "∩" is a bridge. D is the atom or atom group bonded to the metal atom. The two donor groups D may be identical or different. This may also give rise to asymmetrical ligands of the form D∩D'. The negative charge can be introduced in various ways: either the bonding atoms or the bonding atom groups are charged, or the bridge "∩" is charged. However, D∩D may also be neutral. The bridge is atoms or atom groups which carry the donor groups D. Suitable for this purpose are, for example, alkyl or aryl groups which have been functionalised with the groups D in such a way that they allow bridging, i.e. the two groups D are oriented or can be oriented in such a way that they point in the same direction. In other words, the bridge must enable highly parallel orientation of the free electron pairs of the donor group D:

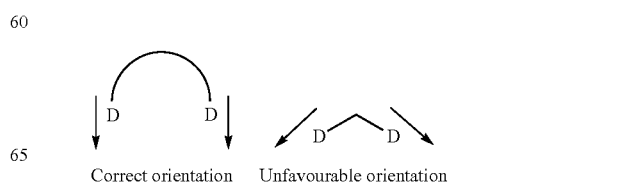

Correct orientation    Unfavourable orientation

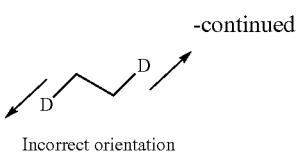

Incorrect orientation

Neutral, Bridging Ligands:

Here, the donor groups D can be: $R_2N$—, $R_2P$—, $R_2As$—, $R_2N$—, CN—, NC—, RO—, RS—, RSe—, RN= ("—" or "=" denotes the bonding mode by means of which the group D is bonded to the bridge).

The following ligand systems come into consideration, preferably with a short bridge "∩": $R_2E$-$CR_2$-$ER_2$; $R_2E$-$CR_2$—$CR_2$-$ER_2$; $R_2E$-$NR$-$ER_2$; $R_2E$-$O$-$ER_2$, where E is, identically or differently on each occurrence, N, P or As; R here has the above-mentioned meaning. Dinitriles and diisonitriles NC∩CN and CN∩NC, dialcohols HO∩OH, diethers RO∩OR, dithiols HS∩SH, dithioethers RS∩SR, diselenides HSenSeH and RSenSeR or combinations of the donor groups (D∩D') can likewise be used.

The bridge is, for example, $\cap = (CR_2)_n$ (n=1-6) or aromatic systems which have been functionalised with the donor groups D. The preferred bridge length here is n=1 if the coordinating atom is P or As and is n=2 or 3 for other coordinating atoms.

Some examples of D∩D:

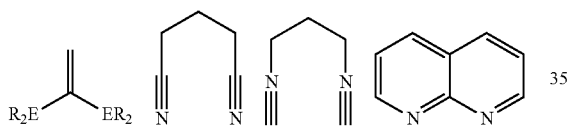

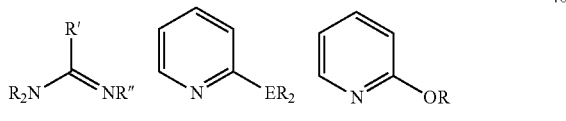

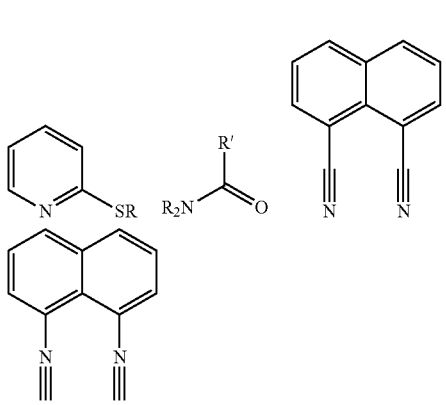

where E has the above-mentioned meaning, and R, R' and R" stand for any desired substituents, preferably for an alkyl, aryl or heteroaryl group.

Anionic, Bridging Ligands:

Here, one or two donor groups D are negatively charged, or the bridge "∩" carries the charge. Frequently used anionic donor groups are: $^-O$—, $^-S$—, $^-Se$—, $^-NR$—, $^-CH_2$—, $^-CH=$, $^-C\equiv C$—. The two donor groups D may again be identical (D∩D) or different (D∩D').

Examples:

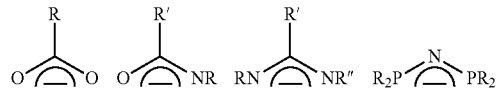

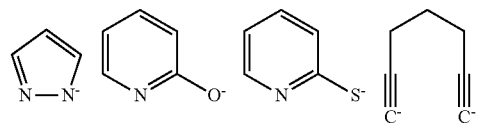

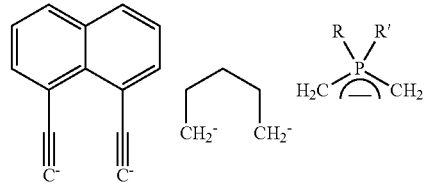

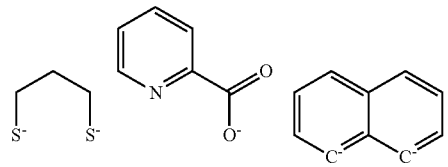

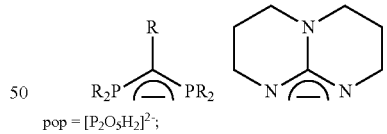

pop = $[P_2O_5H_2]^{2-}$;

B.2 Metal Complexes

The metal complexes have the general form I-VIII:

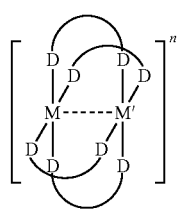

I

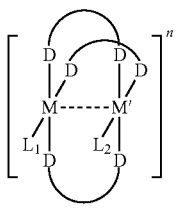

II

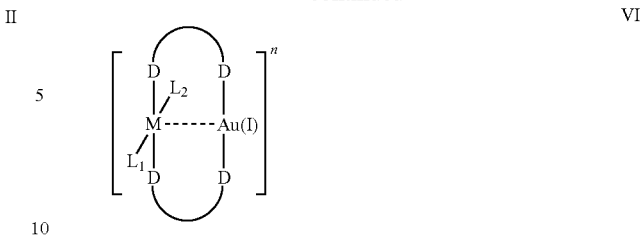

VI

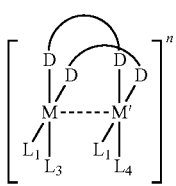

III

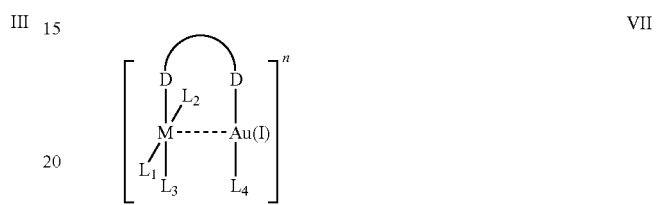

VII

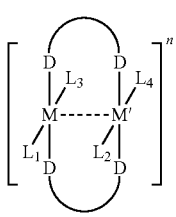

IV

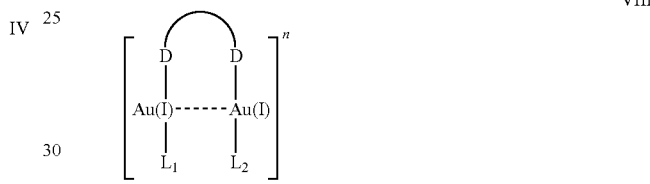

VIII

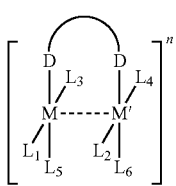

V

M and M' can be Rh(I), Ir(I), Pd(II), Pt(II) or Au(III). The two metals may be either identical (M=M') or different (M≠M'). The two metals are preferably identical. The bridging ligand D∩D may either be identical, or two or more different bridging ligands may be present in the complex. The ligands L1-L6 may likewise be identical or differ from one another. Depending on the choice of the metal centres and the ligands, the complexes may be neutral or positively or negatively charged (n=−4, −3, −2, −1, 0, 1, 2, 3, 4, 5, 6). Preference is given to complexes having the charge n=0.

In a preferred embodiment of the invention, complexes where M=M'=Au(I) are excluded. In a particularly preferred embodiment of the invention, M and M' are not equal to Au.

The following M-M bonds are possible in accordance with the invention:

| | | | | |
|---|---|---|---|---|
| Rh(I)—Rh(I) | Ir(I)—Ir(I) | Pd(II)—Pd(II) | Pt(II)—Pt(II) | Au(I)—Au(III) |
| Rh(I)—Ir(I) | Ir(I)—Pd(II) | Pd(II)—Pt(II) | Pt(II)—Au(I) | Au(I)—Au(I) |
| Rh(I)—Pd(II) | Ir(I)—Pt(II) | Pd(II)—Au(I) | Pt(II)—Au(III) | |
| Rh(I)—Pt(II) | Ir(I)—Au(I) | Pd(II)—Au(III) | | |
| Rh(I)—Au(I) | Ir(I)—Au(III) | | | |
| Rh(I)—Au(III) | | | | |

Some dinuclear complexes described in the literature which have the corresponding, advantageous photophysical properties are intended to illustrate the invention [4, 5]:

| | |
|---|---|
| [Au(I)Ir(I)Cl(CO)(μ-dppm)$_2$]PF$_6$ | (dppm = Ph$_2$PCH$_2$PPh$_2$) |
| [Au(I)Rh(I)(t-BuNC)$_2$(μ-dppm)$_2$]PF$_6$ | |
| [Pt(II)$_2$(CN)$_2$Rh(I)(t-BuNC)$_2$(μ-dppm)$_2$]PF$_6$ | |
| [Au(I)Pt(II)(CN)$_2$(μ-dppm)$_2$]PF$_6$ | |
| Pt(II)$_2$(CN)$_4$(μ-dppm)$_2$ | |
| K$_4$[Pt(II)$_2$pop$_4$] | (pop = [P$_2$O$_5$H$_2$]$^{2-}$) |
| [Ir(I)Cl(CO)(μ-dppm)]$_2$ | |
| [Rh(I)$_2$(t-BuNC)$_4$(μ-dppm)$_2$][PF$_6$]$_2$ | |
| [Rh(I)$_2$(bridge)$_2$][BPh$_4$]$_2$ | (bridge = 1,3-diisocyanopropane) |

The above-mentioned complexes may be the subject-matter of various embodiments of the invention, in particular in the case of the use of the said complexes in opto-electronic components.

C. Trinuclear Metal Complexes

C.1 Ligands

Tridentate ligands which are able to connect the metal centres so that they are arranged in a row are used here.

The ligand D∩D∩D carries three donor groups D, which, analogously to B.1, represent atoms or atom groups which are bonded to the metal atom and are connected by two bridges "∩". Again, either the bonding atoms or the bonding atom groups are charged, or the bridge(s) "∩" is/are charged. The ligands may also be neutral. The bridge is defined analogously to B.1. In the ligand D∩D∩D, the bridges "∩" may be identical or different, and the donor groups D may likewise be identical or different (combinations: D∩D∩D', D∩D'∩D, D∩D'∩D").

Examples:

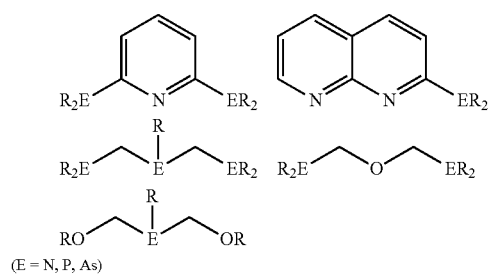

(E = N, P, As)

C.2 Complexes

The metal complexes have the general formulae (IX) to (XV):

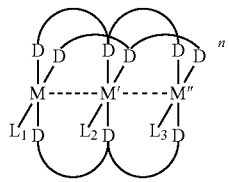

IX

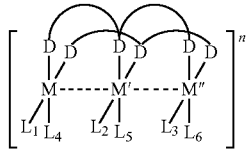

X

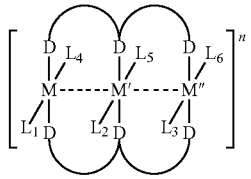

XI

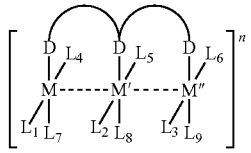

XII

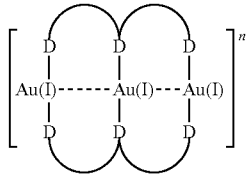

XIII

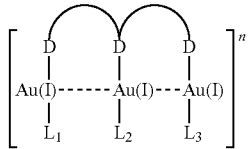

XIV

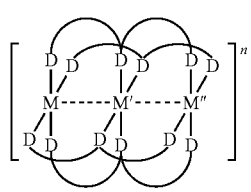

XV

M, M' and M" can be Rh(I), Ir(I), Pd(II), Pt(II) or Au(III). The metals may either be identical (M=M'=M") or different (M≠M'≠M"; M=M'≠M").

The ligands L1-L9 are again defined as under A and may either be identical to or different from one another. The complexes may be neutral, cationic or anionic (n=−3, −2, −1, 0, 1, 2, 3, 4, 5, 6, 7, 8, 9). Preference is given to complexes having the charge n=0.

The metal complex is preferably employed in an emitter layer of an organic electroluminescent device, where the concentration of the complex in the layer is preferably 0.1-50% by vol., particularly preferably 1 to 30% by vol., very particularly preferably 2% by vol. to 20% by vol.

Furthermore, the metal complex is preferably employed in an absorber layer in an organic solar cell, where the proportion of the complex in the layer is preferably 30 to 100% by vol.

The term "energetically high energy states" relates, in particular, to ligands whose lowest triplet states are above 25,000 cm$^{-1}$. The energy of the triplet states arises experimentally from the emission edge (the greatest energy) of the phosphorescence spectrum.

The invention is now explained in greater detail with reference to the drawing of FIG. 1. FIG. 1 shows the singlet harvesting effect. In the electroluminescence process, the singlet state $S_1$ is occupied via the singlet path (25%) and the triplet state $T_1$ via the triplet path (75%). After the very rapid process of intersystem crossing (ISC), the singlet excitation also relaxes very quickly into the triplet state $T_1$, i.e. all the excitation energy is collected in the triplet state $T_1$ (triplet harvesting) [1]. In the case of the metal complexes used in accordance with the invention, which have a small energy difference between states $T_1$ and $S_1$, state $S_1$ is thermally re-occupied very effectively in accordance with $k_B T$ (thermal equilibrium). As a consequence, a very short decay time of the emission results.

CITED LITERATURE

[1] H. Yersin, Editor, "Highly Efficient OLEDs with Phosphorescent Materials", Wiley-VCH, Weinheim 2008.
[2] H. Yersin, Top. Curr. Chem. 2004, 241, 1.
[3] K. Walzer, B. Maennig, M. Pfeiffer, K. Leo, Chem. Rev. 2007, 107, 1233.
[4] D. R. Striplin, G. A. Crosby, J. Phys. Chem. 1995, 7977.
[5] V. M. Miskowski et al., J. Am Chem. Soc. 1978, 100, 485.

The invention is explained in greater detail by the following examples, without wishing to restrict it thereby. The person skilled in the art will be able to carry out the invention throughout the range disclosed, without being inventive, and thus produce further organic electroluminescent devices according to the invention.

EXAMPLES

Examples of dinuclear metal complexes having a small singlet-triplet separation in which the singlet harvesting effect occurs are the following complexes:

Example 1

[Rh$_2$(bridge)$_4$](BPh$_4$)$_2$ (where Bridge=1,3-diisocyano-propane)

Ref.: V. M. Miskowski, G. L. Nobinger, D. S. Kliger, G. S. Hammond, N. S. Lewis, K. R. Mann, H. B. Gray, J. Am. Chem. Soc. 1978, 100, 485.

Example 2

[Rh(CO)(Cl)(dam)]$_2$ (where dam=bis(diphenylarsino)methane)

Ref.: M. I. S. Kenney, J. W. Kenney III, G. A. Crosby, Organometallics 1986, 5, 230.

Example 3

[Rh$_2$(CO)(Cl)(dam)$_2$](BPh$_4$) (where dam=bis(diphenyl-arsino)methane)

Ref.: M. I. S. Kenney, J. W. Kenney III, G. A. Crosby, Inorg. Chem. 1986, 25, 1506.

Example 4

[Rh$_2$(dimen)$_4$](PF$_6$)$_2$ (where dimen=1,8-diisocyano-methane)

Ref.: V. M. Miskowski, S. F. Rice, H. B. Gray, R. F. Dallinger, S. J. Milder, M. G. Hill, C. L. Exstrom, K. R. Mann, Inorg. Chem. 1994, 33, 2799.

Example 5

Production and Characterisation of Organic Electroluminescent Devices

LEDs are produced by the general process outlined below. This must of course be adapted to the particular circumstances in individual cases (for example layer-thickness variation in order to achieve optimum efficiency or colour).

General Process for the Production of OLEDs:

The production of such components is based on the production of polymeric light-emitting diodes (PLEDs), which has already been described a number of times in the literature (for example in WO 04/037887). In the present case, the compounds according to the invention are dissolved in toluene or chlorobenzene together with the matrix materials or matrix-material combinations indicated. The typical solids content of such solutions is between 10 and 25 g/l if, as here, the layer thickness of 80 nm which is typical for a device is to be achieved by means of spin coating.

The emitter and matrix materials used are the following compounds:

| Emitter | Formula | CAS |
|---|---|---|
| E1 | [Ir(CO)Cl(dppm)]$_2$ | 99511-21-4 |
| E2 | [Ir(CO)Cl(dam)]$_2$ | 99511-22-5 |
| E3 | [Rh(CO)Cl(dam)]$_2$ | 99511-23-6 |
| E4 | [Rh$_2$(CO)$_2$Cl(dppm)$_2$]BPh$_4$ | 67202-35-1 |
| E5 | [Rh$_2$(CO)$_2$Cl(dam)$_2$]BPh$_4$ | 70561-97-6 |
| E6 | [Rh$_2$(bridge)$_4$](BPh$_4$)$_2$ | 61156-18-1 |
| E7 | [Pt(dppm)(CN)$_2$]$_2$ | 83789-83-7 | dam: bis(diphenylarsino)methane, [19364-57-9]

bridge: 1,3-diisocyanopropane dppm: bis(diphenylphosphino)methane

-continued
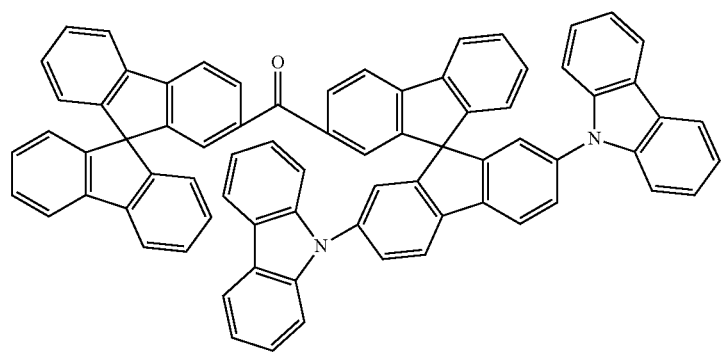 [SMILES: O=C(c1ccc2c(c1)C1(c3ccccc3-c3ccccc31)c1ccccc1-2)c1ccc2c(c1)C1(c3ccccc3-2)c2cc(-n3c4ccccc4c4ccccc43)ccc2-c2ccc(-n3c4ccccc4c4ccccc43)cc21]
compound 1
[959422-18-5]
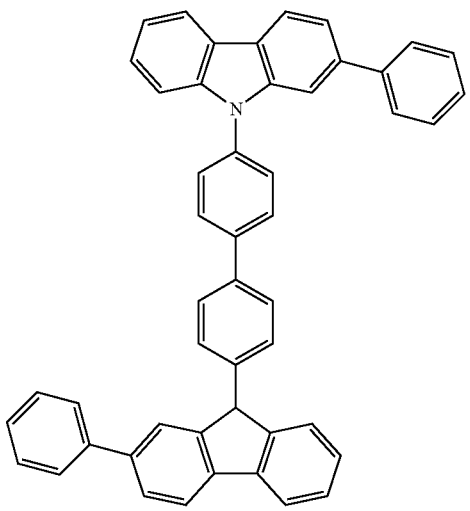 [SMILES: c1ccc(-c2ccc3c(c2)C(c2ccc(-c4ccc(-n5c6ccccc6c6ccc(-c7ccccc7)cc65)cc4)cc2)c2ccccc2-3)cc1]
compound 2
[1040882-55-0]
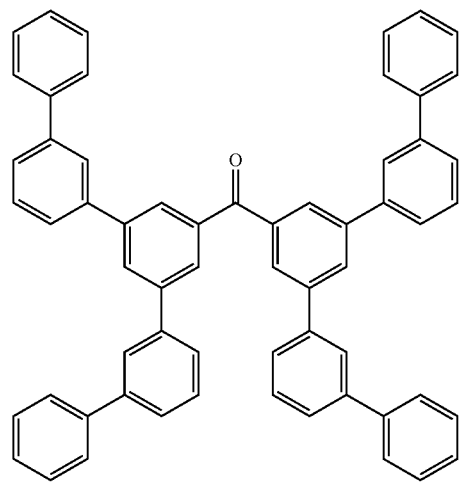 [SMILES: O=C(c1cc(-c2cccc(-c3ccccc3)c2)cc(-c2cccc(-c3ccccc3)c2)c1)c1cc(-c2cccc(-c3ccccc3)c2)cc(-c2cccc(-c3ccccc3)c2)c1]
compound 3
DE102008033943.1

OLEDs having the following structure are produced analogously to the general process mentioned above:
PEDOT 20 nm (spin-coated from water; PEDOT purchased from BAYER AG; poly[3,4-ethylenedioxy-2,5-thiophene])
Matrix+emitter 80 nm, 5% by weight emitter concentration (spin-coated from toluene or chlorobenzene)
Ba/Ag 10 nm of Ba/150 nm of Ag as cathode.

Structured ITO substrates and the material for the so-called buffer layer (PEDOT, actually PEDOT:PSS) are commercially available (ITO from Technoprint and others, PEDOT:PSS as aqueous dispersion Clevios Baytron P from H. C. Starck). The emission layer is applied by spin coating in an inert-gas atmosphere, argon in the present case, and dried by heating at 120° C. for 10 min. Finally, a cathode comprising barium and silver applied by vacuum vapour deposition. The solution-processed devices are characterised by standard methods, the OLED examples mentioned have not yet been optimised.

Table 1 shows the efficiency and voltage at 500 cd/m$^2$ and the colour.

TABLE 1

| Ex. | Matrix Emitter | Efficiency [cd/A] | Voltage [V] | Colour CIE x/y |
|---|---|---|---|---|
| 6 | E1 PVK* | 0.3 | 4.7 | 0.61/0.35 |
| 7 | E1 Compound 1 | 0.9 | 4.6 | 0.70/0.30 |
| 8 | E2 Compound 2 | 2.1 | 4.8 | 0.63/0.27 |
| 9 | E3 Compound 2 | 1.5 | 4.8 | 0.70/0.30 |
| 10 | E2 Comp. 2 (20% by wt.) Comp. 3 (75% by wt.) | 3.1 | 4.3 | 0.63/0.27 |
| 11 | E4 Comp. 2 (40% by wt.) Comp. 3 (55% by wt.) | 0.7 | 5.4 | 0.70/0.30 |
| 12 | E5 Compound 3 | 1.8 | 5.5 | 0.69/0.31 |
| 13 | E6 Compound 2 | 0.7 | 6.4 | 0.70/0.30 |
| 14 | E7 Compound 3 | 6.1 | 5.7 | 0.14/0.17 |

*PVK: Mw = 1,100,000 g/mol, purchased from Aldrich

The invention claimed is:

1. An organic electroluminescent device comprising a luminescent metal complex which has a ΔE separation between the lowest triplet state and the higher singlet state of between 50 cm$^{-1}$ and 500 cm$^{-1}$ wherein the metal complex is a binuclear complex and wherein the metals having a d$^8$ electron configuration are used in the metal complex.

2. The organic electroluminescent device according to claim 1, wherein the metal complex is employed in the emitter layer, where the proportion of the metal complex in the emitter layer is between 0.1 and 50% by weight.

3. The organic electroluminescent device according to claim 1, wherein metals Rh(I), Ir(I), Pd(II), Pt(II) or Au(III) is used in the metal complexes.

4. The organic electroluminescent device according to claim 1, wherein Au(I) is used in the metal complexes.

5. An organic electroluminescent device comprising a luminescent metal complex which has a ΔE separation between the lowest triplet state and the higher singlet state of between 50 cm$^{-1}$ and 500 cm$^{-1}$, wherein the metal complex is a binuclear complex, and wherein the binuclear metal complex has the general formula I-VIII:

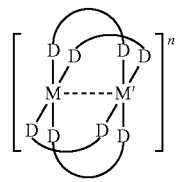

I

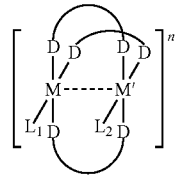

II

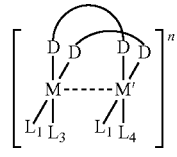

III

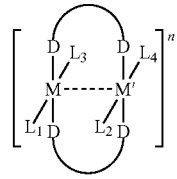

IV

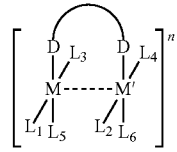

V

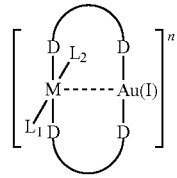

VI

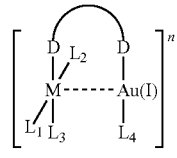

VII

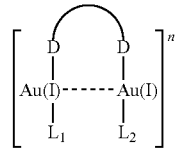

VIII where:
M, M' are, identically or differently on each occurrence, Rh(I), Ir(I), Pd(II), Pt(II) or Au(III);
D∩D is, identically or differently on each occurrence, a bidentate ligand containing the donor atoms D;
$L_1$-$L_6$ is, identically or differently on each occurrence, a monodentate ligand
n is the charge of the complex and is −4, −3, −2, −1, 0, 1, 2, 3, 4, 5, 6.

6. The organic electroluminescent device according to claim 5, wherein M-M' in structures I to VIII is selected from:

| | | | | |
|---|---|---|---|---|
| Rh(I)—Rh(I) | Ir(I)—Ir(I) | Pd(II)—Pd(II) | Pt(II)—Pt(II) | Au(I)—Au(III) |
| Rh(I)—Ir(I) | Ir(I)—Pd(II) | Pd(II)—Pt(II) | Pt(II)—Au(I) | Au(I)—Au(I) |
| Rh(I)—Pd(II) | Ir(I)—Pt(II) | Pd(II)—Au(I) | Pt(II)—Au(III) | |
| Rh(I)—Pt(II) | Ir(I)—Au(I) | Pd(II)—Au(III) | | |
| Rh(I)—Au(I) | Ir(I)—Au(III) | | | |
| Rh(I)—Au(III) | | | | |

7. The organic electroluminescent device according to claim 5, wherein the ligands $L_1$ to $L_6$, are selected from the group consisting of carbon monoxide, nitrogen monoxide, nitriles, isonitriles, ethers, sulfides, selenides, amines, imines, phosphines, phosphites, arsines, stibines, nitrogen-containing heterocycles, hydride, deuteride, F, Cl, Br, I, azide, alkylacetylides, aryl- or heteroarylacetylides, alkyl, aryl, heteroaryl, hydroxide, cyanide, cyanate, isocyanate, thiocyanate, isothiocyanate, aliphatic or aromatic alcoholates, aliphatic or aromatic thioalcoholates, amides, carboxylates, anionic, nitrogen-containing heterocycles, aliphatic or aromatic phosphides $PR_2^-$, aliphatic or aromatic selenides $SeR^-$, $O^{2-}$, $S^{2-}$, nitrenes, diamines, diimines, heterocycles containing two nitrogen atoms, diphosphines, 1,3-diketonates derived from 1,3-diketones, 3-ketonates derived from 3-ketoesters, carboxylates derived from aminocarboxylic acids, salicyliminates derived from salicylimines, dialcoholates, dithiolates derived from dithiols, and ligands which, with the metal, form a cyclometallated five- or six-membered ring with at least one metal-carbon bond.

8. The organic electroluminescent device according to claim 5, wherein the donor groups D are selected from $R_2N$—, $R_2P$—, $R_2As$—, $R_2N$—, CN—, NC—, RO—, RS—, RSe—, RN=, $^-$O—, $^-$S—, $^-$Se—, $^-$NR—, $^-CH_2$—, $^-$CH= or $^-$C≡C—, where "—" or "=" denotes the bond from the group D to the bridge, and where R is a substituent.

9. The organic electroluminescent device according to claim 5, wherein the ligand D∩D is selected from the group consisting of $R_2E\text{-}CR_2\text{-}ER_2$; $R_2E\text{-}CR_2$—$CR_2\text{-}ER_2$; $R_2E\text{-}NR\text{-}ER_2$; $R_2E\text{-}O\text{-}ER_2$, where E is, identically or differently on each occurrence, N, P or As, dinitriles NC∩CN, diisonitriles CN∩NC, dialcohols HO∩OH, diethers RO∩OR, dithiols HS∩SH, dithioethers RS∩SR, diselenides HSe∩SeH, RSe∩SeR or combinations of the donor groups, where the bridge ∩ stands for $(CR_2)_n$ (n=1-6) or aromatic systems, and where R stands for a substituent.

10. A process for the generation of light having a certain wavelength, including the step of providing the complex according to one of formulae I to VIII according to claim 5.

11. A process for the generation of blue emission using a metal complex according to one of formulae I to V according to claim 5, where the metal centres M and M' stand, identically or differently, for Pt or Pd.

12. The organic electroluminescent device according to claim 5, wherein n is 0.

\* \* \* \* \*